(12) United States Patent
Thottappayil et al.

(10) Patent No.: US 12,020,907 B2
(45) Date of Patent: Jun. 25, 2024

(54) FACEPLATE WITH LOCALIZED FLOW CONTROL

(71) Applicant: Applied Materials, Inc., Santa Clara, CA (US)

(72) Inventors: Arun Thottappayil, Bangalore (IN); Mayur Govind Kulkarni, Bangalore (IN); Junghoon Sun, San Jose, CA (US); Jun Tae Choi, Cupertino, CA (US); Hang Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 637 days.

(21) Appl. No.: 16/844,106

(22) Filed: Apr. 9, 2020

(65) Prior Publication Data
US 2021/0319981 A1    Oct. 14, 2021

(51) Int. Cl.
*H01J 37/32*    (2006.01)
*H01L 21/02*    (2006.01)

(52) U.S. Cl.
CPC .. *H01J 37/32449* (2013.01); *H01J 37/32366* (2013.01); *H01J 37/32513* (2013.01);
(Continued)

(58) Field of Classification Search
CPC ........... H01J 37/32449; H01J 37/32366; H01J 37/32513; H01J 37/32623;
(Continued)

(56) References Cited

U.S. PATENT DOCUMENTS

| 5,744,049 A | 4/1998 | Hills et al. |
| 6,050,506 A * | 4/2000 | Guo ...................... C23C 16/455 |
| | | 239/560 |

(Continued)

FOREIGN PATENT DOCUMENTS

| TW | 200936931 A | 9/2009 |
| TW | 201704516 A | 2/2017 |

OTHER PUBLICATIONS

International Search Report and Written Opinion dated Jul. 15, 2021 in International Patent Application No. PCT/US2021/024049, 7 pages.
(Continued)

*Primary Examiner* — Rudy Zervigon
(74) *Attorney, Agent, or Firm* — Kilpatrick Townsend & Stockton LLP (57) ABSTRACT

Exemplary semiconductor processing chambers may include a gasbox. The chambers may include a substrate support. The chambers may include a blocker plate positioned between the gasbox and the substrate support. The blocker plate may define a plurality of apertures through the plate. The chambers may include a faceplate positioned between the blocker plate and the substrate support. The faceplate may be characterized by a first surface facing the blocker plate and a second surface opposite the first surface. The faceplate may be characterized by a central axis. The faceplate may define a plurality of apertures through the faceplate distributed in a number of rings. Each ring of apertures may include a scaled increase in aperture number from a ring radially inward. A radially outermost ring of apertures may be characterized by a number of apertures reduced from the scaled increase in aperture number.

18 Claims, 5 Drawing Sheets

(52) U.S. Cl.
CPC .. *H01J 37/32623* (2013.01); *H01J 37/32743* (2013.01); *H01J 37/32834* (2013.01); *H01L 21/0262* (2013.01); *H01J 2237/332* (2013.01)

(58) Field of Classification Search
CPC ........... H01J 37/32743; H01J 37/32834; H01J 2237/332; H01L 21/0262; H01L 21/67103; H01L 21/67109; H01L 21/68742; H01L 21/6719
USPC ................ 118/715; 156/345.33, 345.34
See application file for complete search history.

(56) References Cited

U.S. PATENT DOCUMENTS

| | | | |
|---|---|---|---|
| 6,125,788 | A | 10/2000 | Hills et al. |
| 2002/0042192 | A1 | 4/2002 | Tanaka et al. |
| 2005/0255257 | A1* | 11/2005 | Choi .................. H01L 21/0217 257/E21.279 |
| 2009/0275206 | A1 | 11/2009 | Katz et al. |
| 2013/0319612 | A1* | 12/2013 | Su ........................... C23C 16/50 427/9 |
| 2015/0247237 | A1 | 9/2015 | Ha et al. |
| 2016/0099147 | A1* | 4/2016 | Kulshreshtha .......... C23C 16/26 118/725 |
| 2017/0167024 | A1* | 6/2017 | Wiltse ................ C23C 16/45565 |
| 2018/0096843 | A1 | 4/2018 | Kulshreshtha et al. |
| 2018/0320267 | A1 | 11/2018 | Kim et al. |
| 2019/0043727 | A1 | 2/2019 | Korolik et al. |
| 2019/0284695 | A1* | 9/2019 | Huang ............. C23C 16/45502 |

OTHER PUBLICATIONS

International Preliminary Report on Patentability dated Oct. 20, 2022 in International Patent Application No. PCT/US2021/024049, 6 pages.

* cited by examiner

FACEPLATE WITH LOCALIZED FLOW CONTROL

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

SUMMARY

Exemplary semiconductor processing chambers may include a gasbox. The chambers may include a substrate support. The chambers may include a blocker plate positioned between the gasbox and the substrate support. The blocker plate may define a plurality of apertures through the plate. The chambers may include a faceplate or showerhead positioned between the blocker plate and the substrate support. The faceplate may be characterized by a first surface facing the blocker plate and a second surface opposite the first surface. The second surface of the faceplate and the substrate support may at least partially define a processing region within the semiconductor processing chamber. The faceplate may be characterized by a central axis. The faceplate may define a plurality of apertures through the faceplate distributed in a number of rings. Each ring of apertures may include a scaled increase in aperture number from a ring radially inward. A radially outermost ring of apertures may be characterized by a number of apertures reduced from the scaled increase in aperture number.

In some embodiments, the apertures of the radially outermost ring may be distributed equidistantly about the radially outermost ring. The radially outermost ring of apertures may be characterized by a number of apertures that is less than or about 75% of the number of apertures according to the scaled increase in apertures. An inwardly adjacent ring of apertures from the radially outermost ring of apertures may be characterized by a number of apertures reduced from the scaled increase in aperture number. The inwardly adjacent ring of apertures from the radially outermost ring of apertures may be characterized by a number of apertures that is less than or about 75% of the number of apertures according to the scaled increase in apertures. The scaled increase in aperture number within each corresponding ring may follow an equation: $XR$, where $X$ is a base number of apertures, and $R$ is a corresponding ring number. The faceplate may define at least 30 rings of apertures. The base number of apertures may be an integer between four and eight. The chambers may include a chamber housing extending about the substrate support. The chamber housing may define an access configured to allow delivery of a semiconductor substrate along a portion of the chamber housing. The faceplate may be characterized by a reduction of apertures through a section of the faceplate proximate the access in the chamber housing. The chambers may include a pumping liner extending radially about the semiconductor processing chamber between the faceplate and the substrate support. The pumping liner may be configured to exhaust effluents radially outward from a processing region of the semiconductor processing chamber.

Some embodiments of the present technology may encompass semiconductor processing chamber faceplates, which may be characterized by a first surface and a second surface opposite the first surface. The faceplate may be characterized by a central axis extending through the first surface and the second surface. The faceplate may define a plurality of apertures through the faceplate distributed in a number of concentric rings about the central axis. Each ring of apertures may include a scaled increase in aperture number from a ring radially inward. A radially outermost ring of apertures may be characterized by a number of apertures reduced from the scaled increase in aperture number. The apertures of the radially outermost ring may be characterized by an equiangular distribution from one another about the radially outermost ring.

In some embodiments the radially outermost ring of apertures may be characterized by a number of apertures that is less than or about 50% of the number of apertures according to the scaled increase in apertures. An inwardly adjacent ring of apertures from the radially outermost ring of apertures may be characterized by a number of apertures reduced from the scaled increase in aperture number. The inwardly adjacent ring of apertures from the radially outermost ring of apertures may be characterized by a number of apertures that is less than or about 75% of the number of apertures according to the scaled increase in apertures. No more than 5 radially outermost rings may be characterized by a number of apertures reduced from the scaled increase in aperture number. The scaled increase in aperture number within each corresponding ring may follow an equation: $XR$, where $X$ is a base number of apertures, and $R$ is a corresponding ring number. The faceplate may define at least 30 rings of apertures. The base number of apertures may be an integer between three and eight.

Some embodiments of the present technology may encompass methods of semiconductor processing. The methods may include flowing a precursor into a processing chamber. The processing chamber may include a faceplate and a substrate support on which a substrate is disposed. A processing region of the processing chamber may be at least partially defined between the faceplate and the substrate support. The faceplate may define a plurality of apertures through the faceplate distributed in a number of rings. Each ring of apertures may include a scaled increase in aperture number from a ring radially inward. A radially outermost ring of apertures may be characterized by a number of apertures reduced from the scaled increase in aperture number. The methods may include generating a plasma of the precursor within the processing region of the processing chamber. The methods may include depositing a material on the substrate.

Such technology may provide numerous benefits over conventional systems and techniques. For example, embodiments of the present technology may allow controlled deposition at an edge region of a substrate. Additionally, the components may include aperture adjustments to accommodate deposition non-uniformity due to chamber component asymmetry. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, dielectric films, hardmask films, or other material layers may be formed to facilitate structural formation or patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral distribution of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, pedestal heater leveling, process gas mixture uniformity, plasma or RF delivery symmetry, and other aspects of processing may impact the films on the substrate, creating film uniformity differences across the substrate for materials produced or removed. For example, one or more devices may be included within a processing chamber for delivering and distributing precursors within a processing chamber. A blocker plate may be included in a chamber to provide a choke in precursor flow, which may increase residence time at the blocker plate and lateral or radial distribution of precursors. A faceplate may further improve uniformity of delivery into a processing region, which may improve deposition or etching.

Some chambers may include additional aspects that may produce non-uniformity in deposition profiles. For example, some chambers may include a radial plenum for exhaust, which may affect residence time of precursors within the chamber, as well as a pumping or exhaust port that is offset within the chamber. In some other examples of deposition or other processing chambers, a slit valve may be included on the chamber sidewall to allow access for a robot to deliver and retrieve substrates. This asymmetrical feature on the chamber may impact deposition. For example, a temperature profile within the chamber may be impacted by the slit valve, which may cause an in-plane shift in deposition either towards or away from the region of the substrate. Because many faceplates or showerheads may be characterized by a uniform aperture pattern in one or more ways, conventional faceplates may be incapable of accommodating these chamber features and affects.

The present technology overcomes these challenges during these deposition processes, as well as for any other process that may benefit from controlled edge delivery of precursors. By utilizing one or more chamber components that may alter a flow path through the processing chamber, increased control of the film formation may be afforded. Accordingly, the present technology may produce improved film deposition characterized by improved uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack or gas distribution components according to embodiments of the present technology before additional variations and adjustments to this system according to embodiments of the present technology are described.

Figure 1:
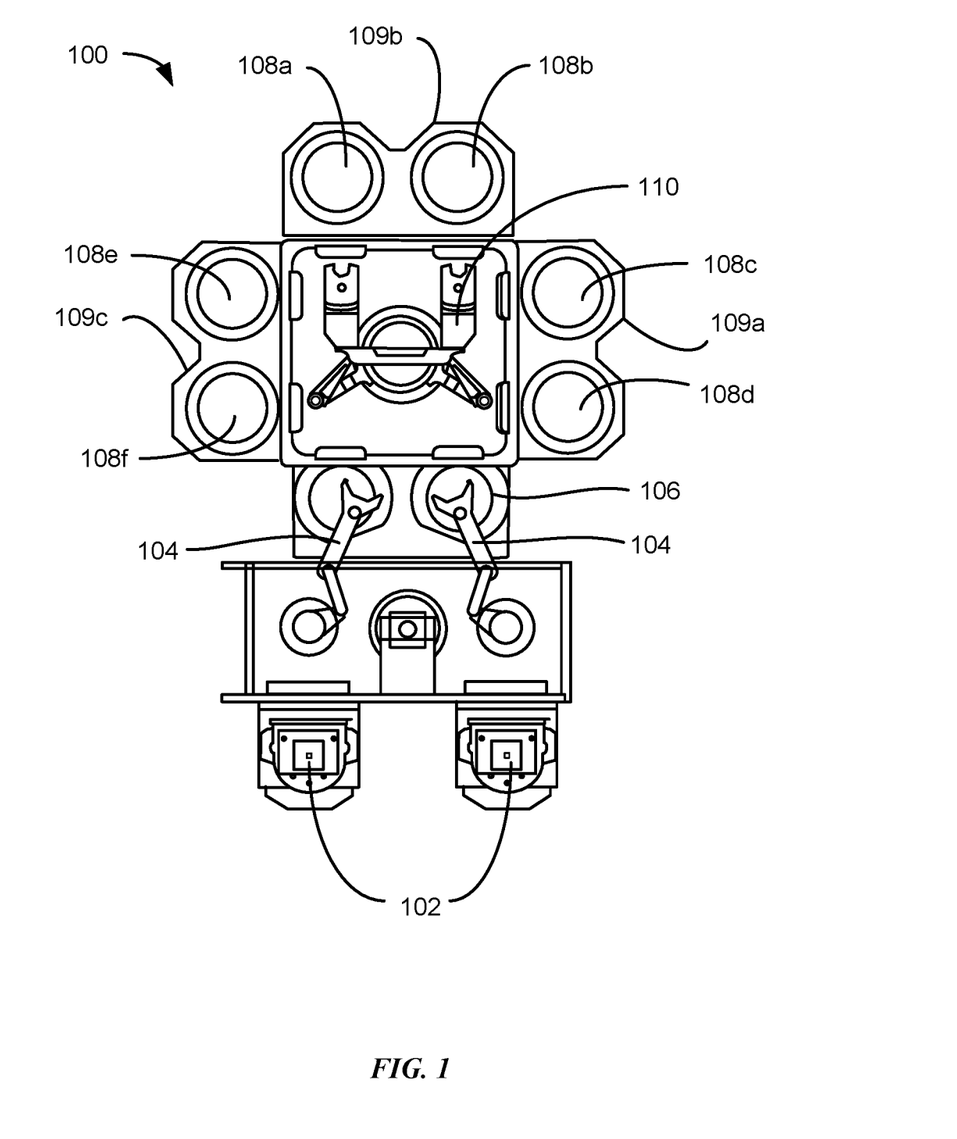
FIG. 1 shows a top plan view of an exemplary processing system according to some embodiments of the present technology.

FIG. 1 shows a top plan view of one embodiment of a processing system 100 of deposition, etching, baking, and curing chambers according to embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back through slit valves on the chamber sidewalls facing the robot, as illustrated. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
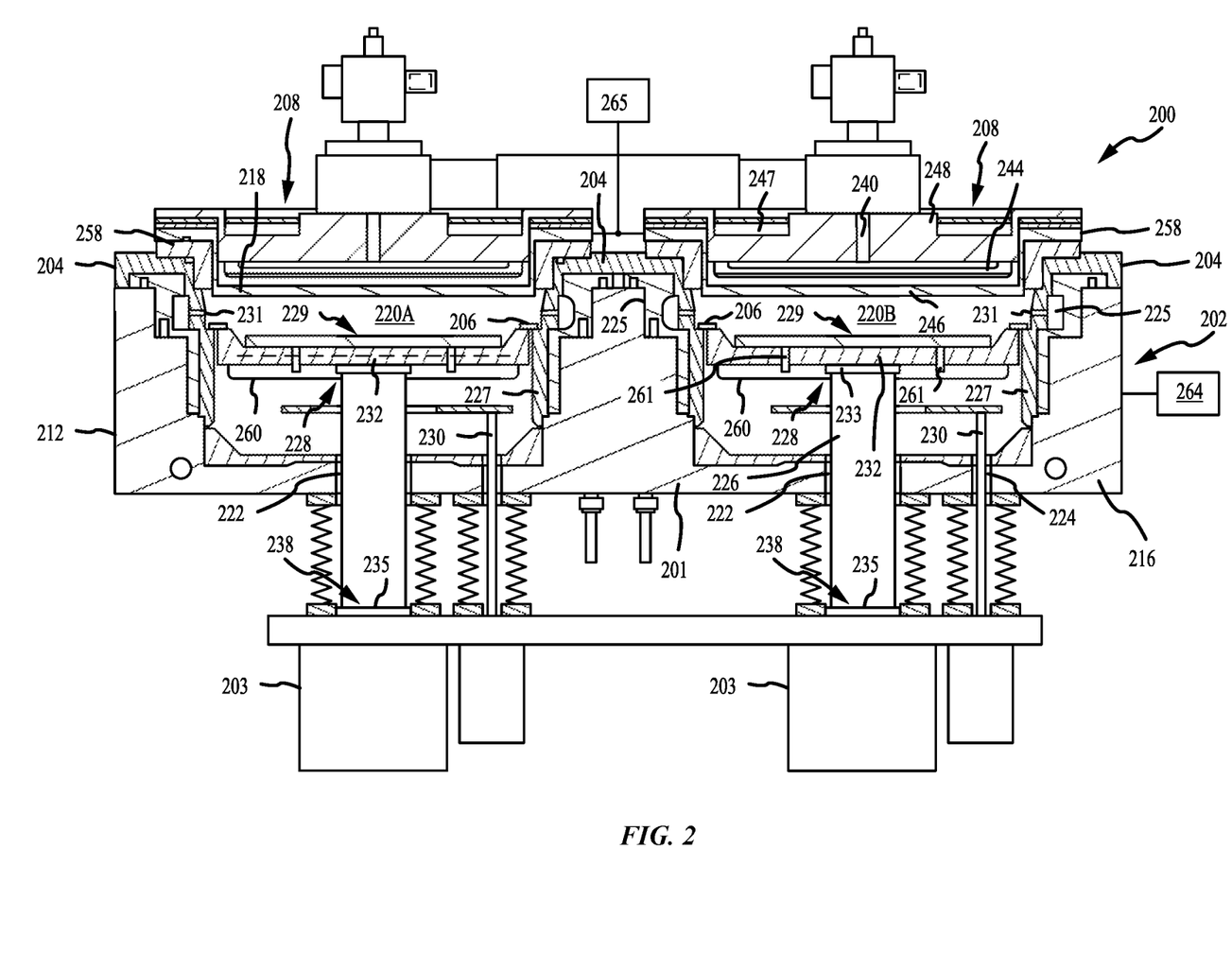
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology as further described below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors, as well as other precursors, through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

As noted, a circumferential pumping cavity 225 may cause a radial flow of precursors, with a velocity profile as precursors exit the processing region through the exhaust ports. This pull of precursors towards radial edges of the substrate and chamber, followed by a choke at the location of the exhaust ports may increase residence time of precursors, such as deposition precursors, at edge regions of the substrate. The increased residence time may, in some embodiments, increase deposition at various locations. Because many faceplates are characterized by uniform patterns, this increased deposition may create a profile non-uniformity characterized by an edge-peak deposition. Additionally, as noted previously, the location of the slit valve, as well as other components within the chamber, may create asymmetric aspects of the chamber configuration, which may challenge uniformity of process conditions. For example, the slit valve leading to a low-pressure region may produce a heat sink, which can affect a temperature at the substrate near the slit valve, and which may affect deposition at that location of the substrate. While the exhaust flow may create a symmetric or radial non-uniformity of deposition, the slit valve may create an in-plane non-uniformity in a specific region of the substrate. By adjusting flow of precursors through the chamber, the present technology may accommodate these asymmetries without requiring adjustment of process conditions.

Figure 3:
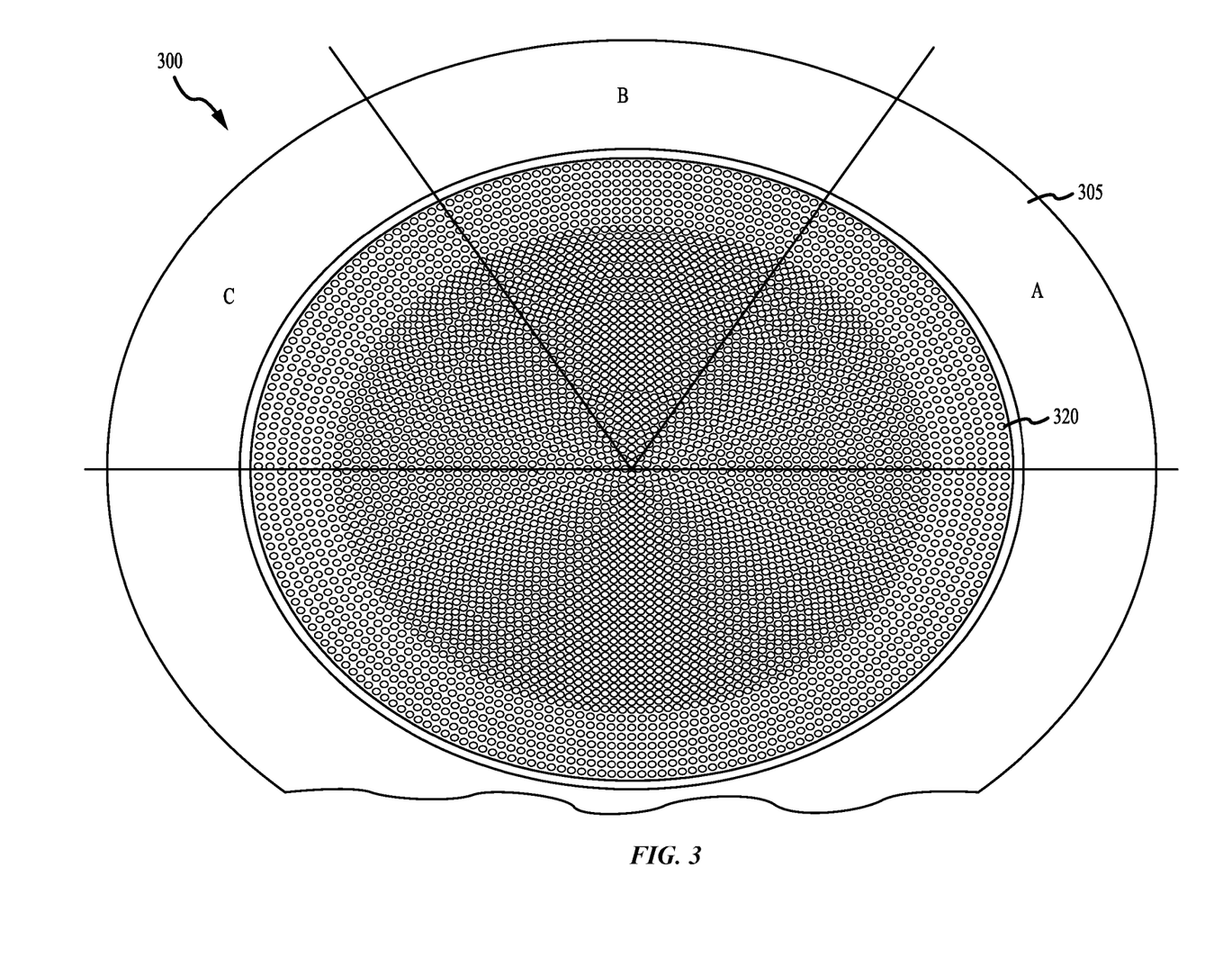
FIG. 3 shows a schematic partial plan view of an exemplary faceplate according to some embodiments of the present technology.

FIG. 3 shows a schematic partial plan view of an exemplary faceplate 300 according to some embodiments of the present technology. FIG. 3 may illustrate further details relating to components in system 200, such as for faceplate 246. Faceplate 300 is understood to include any feature or aspect of system 200 discussed previously in some embodiments. The faceplate 300 may be used to perform semiconductor processing operations including deposition of a variety of materials as previously described, as well as other deposition, removal, and cleaning operations. Faceplate 300 may show a partial view of a faceplate that may be incorporated in a semiconductor processing system, and may illustrate a view across the faceplate, which may otherwise be of any size, and include any number of apertures.

Although shown with a number of apertures extending outward laterally or radially, it is to be understood that the figure is included only for illustration of embodiments, and is not considered to be of scale. For example, exemplary faceplates may be characterized by a number of apertures along a central radius or diameter of greater than or about 20 apertures, and may be characterized by greater than or about 25 apertures, greater than or about 30 apertures, greater than or about 35 apertures, greater than or about 40 apertures, greater than or about 45 apertures, greater than or about 50 apertures, or more. In the figure, a row of apertures is illustrated along a radius of the faceplate, but it is to be understood that the entire central section may be filled with apertures along each individual radius. The apertures may be distributed in a planar or XY pattern, as well as in a radial pattern in which the apertures may be distributed in a number of rings. In these configuration, the rings may be distributed along the central diameter and include any number of rings up to a number based on the noted number of apertures above, and which may extend concentrically about a central axis extending through the plate, which may be coaxial with a center of the processing chamber. The rings may be annular as illustrated in a radial pattern, although any other configuration may similarly be encompassed, such as rings or any other geometry, such as hexagonal patterns, or any other distribution.

As noted, faceplate 300 may be included in any number of processing chambers, including system 200 described above. Faceplate 300 may be included as part of the gas inlet assembly, such as with a gasbox and blocker plate. For example, a gasbox may define or provide access into a processing chamber. A substrate support may be included within the chamber, and may be configured to support a substrate for processing. A blocker plate may be included in the chamber between the gasbox and the substrate support. The blocker plate may include or define a number of apertures through the plate. In some embodiments the blocker plate may be characterized by increased central conductance. For example, in some embodiments a subset of apertures proximate or extending about a central region of the blocker plate may be characterized by a greater aperture diameter than apertures radially outward of the central region. This may increase a central flow conductance in some embodiments. The components may include any of the features described previously for similar components, as well as a variety of other modifications similarly encompassed by the present technology.

Faceplate 300 may be positioned within the chamber between the blocker plate and the substrate support as illustrated previously. Faceplate 300 may be characterized by a first surface 305 as illustrated, and a second surface, which may be opposite the first surface. In some embodiments, first surface 305 may be facing towards a blocker plate, gasbox, or gas inlet into the processing chamber. The second surface or opposite surface may be positioned to face a substrate support or substrate within a processing region of a processing chamber. For example, in some embodiments, the second surface of the faceplate and the substrate support may at least partially define a processing region within the chamber, as previously explained. Faceplate 300 may be characterized by a central axis, which may extend vertically through a midpoint of the faceplate, and may be coaxial with a central axis through the processing chamber. The central axis may extend through the figure at the intersection of the lines illustrated, for example.

Faceplate 300 may define a plurality of apertures 320 defined through the faceplate and extending from the first surface through the second surface. Each aperture 320 may provide a fluid path through the faceplate, and the apertures may provide fluid access to the processing region of the chamber. Depending on the size of the faceplate, and the size of the apertures, faceplate 300 may define any number of apertures through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, greater than or about 10,000 apertures, greater than or about 20,000 apertures, greater than or about 30,000 apertures, or more. As noted above, the apertures may be included in a set of rings extending outward from the central axis, and may include any number of rings as described previously. The rings may be characterized by any number of shapes including circular or elliptical, as well as any other geometric pattern, such as rectangular, hexagonal, or any other geometric pattern that may include apertures distributed in a radially outward number of rings. The apertures may have a uniform or staggered spacing, and may be spaced apart at less than or about 10 mm from center to center either within a ring or between rings. The apertures may also be spaced apart at less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, less than or about 0.5 mm, or less.

The rings may be characterized by any geometric shape as noted above, and in some embodiments, apertures may be characterized by a scaling function of apertures per ring, which may produce a scaled increase in aperture number from each radially inward ring to each ring extending radially outward. For example, in some embodiments a first aperture may extend through a center of the faceplate, such as along the central axis as illustrated. A first ring of apertures may extend about the central aperture, and may include any number of apertures, such as between about 3 and about 10 apertures, between about 3 and about 8 apertures, between about 4 and about 8 apertures, and which may be spaced equally about a geometric shape extending through a center of each aperture. In some embodiments each aperture may be distributed equidistantly or at an equiangular spacing from each other aperture. In some embodiments, certain regions may include or define more or less apertures to accommodate in-plane non-uniformity issues as will be described further below.

Any number of additional rings of apertures may extend radially outward from the first ring, and may include a number of apertures that may be a function of the number of apertures in the first ring. For example, the scaled increase in the number of apertures in each successive ring may be characterized by a number of apertures within each corresponding ring according to the equation XR, where X is a base number of apertures, and R is the corresponding ring number. The base number of apertures may be the number of apertures within the first ring, and in some embodiments may be some other number, as will be described further below where the first ring has an augmented number of apertures. For example, for an exemplary faceplate having 5 apertures distributed about the first ring, and where 5 may be the base number of apertures, the second ring may be characterized by 10 apertures, (5)×(2), the third ring may be characterized by 15 apertures, (5)×(3), and the fortieth ring may be characterized by 200 apertures, (5)×(40). This may continue for any number of rings of apertures as noted previously, such as up to, greater than, or about 50 rings. In some embodiments each aperture of the plurality of apertures across the faceplate may be characterized by an aperture profile, which may be the same or different in embodiments of the present technology.

The apertures may include any profile or number of sections having different profiles. In some embodiments, the faceplates may have at least two sections, at least 3 sections, at least 4 sections, at least 5 sections, or more, defining different profiles through the aperture. In one non-limiting example the apertures may be characterized by a cylindrical profile through the entire aperture or a portion of each aperture. Additionally, each aperture of the plurality of apertures may include an aperture profile including multiple sections, including tapered, flared, cylindrical, or any other aperture profile. In some embodiments adjusting the aperture profile may further affect the flow conductance through apertures. Accordingly, in some embodiments different rings of apertures may be characterized by different aperture profiles, or different regions of the faceplate may be characterized by different aperture profiles.

As illustrated, different sections of the faceplate may be characterized by different aperture numbers or profiles, which may accommodate features of the processing chamber. For example, as previously described, a slit valve or access may be formed in the housing allowing a robot to deliver and retrieve substrates from the substrate support. This may cause temperature differentials at a region of the substrate proximate the slit valve, which may affect deposition. In some embodiments, an associated region of the faceplate may be characterized by a different number of apertures. For example, section B, which may be characterized by any angular section of the faceplate, may extend over or proximate the chamber housing portion defining the slit valve, such as facing the robot transfer chamber as described above. To adjust the deposition profile in this region, the apertures through this section may be different than in adjacent sections A and C, as well as on the opposite side of the faceplate.

For example, section B may be characterized by more or less apertures in embodiments relative to any other similar angular section of the faceplate. For example, while a distance between apertures in each other region may be one distance, the distance between apertures in section B may be greater or smaller to adjust the number of apertures. The aperture distances or spacing may be any of the distances described previously, which may be different spacing from any other ring or between any other rings. Section B may be characterized by any angular section from the central axis, such as greater than or about 15°, and may be greater than or about 20°, greater than or about 25°, greater than or about 30°, greater than or about 35°, greater than or about 40°, greater than or about 45°, greater than or about 50°, greater than or about 55°, greater than or about 60°, greater than or about 65°, greater than or about 70°, greater than or about 75°, greater than or about 80°, greater than or about 85°, greater than or about 90°, greater than or about 95°, greater than or about 100°, greater than or about 105°, greater than or about 110°, greater than or about 115°, greater than or about 120°, or greater. In some embodiments an XY pattern adjustment may also be incorporated for aperture placement, and localized aperture changes may be produced above certain regions, such as the slit valve, for example.

This adjustment to the apertures within a specific section of the faceplate may accommodate non-uniformities caused by chamber asymmetry, such as with the slit valve. To accommodate non-uniformity caused by pumping as described previously, the faceplate may include a tailored number of apertures in certain rings about the faceplate as illustrated. For example, for processes where the increased residence time during exhaust at edge regions creates increased edge deposition, radially outward rings of apertures on the faceplate may be characterized by a number of apertures reduced from the scaled increase in aperture number as described above. Additionally, a distance between rings may be increased or decreased from a standard distance, such as a distance between apertures as discussed above. Accordingly, outer rings may be characterized by increased or decreased distances from adjacent rings in some embodiments.

Figure 4A:
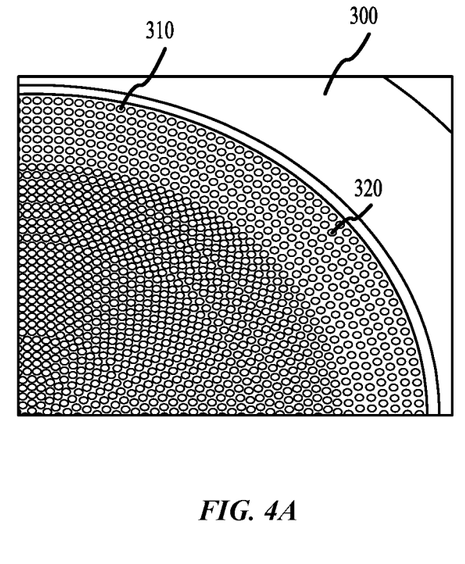
FIG. 4A shows a schematic partial plan view of an exemplary faceplate according to some embodiments of the present technology.

FIG. 4A shows a schematic partial plan view of an exemplary faceplate according to some embodiments of the present technology, and may illustrate a schematic view of faceplate 300, for example, such as with additional detail regarding the outer rings of apertures. As illustrated, faceplate 300 may include a plurality of apertures 320, which may be distributed in a set of rings extending radially outward along the faceplate. For example, from a central aperture, a first ring of apertures including any number of apertures as noted previously may extend about the central aperture, and may be characterized by a base number of apertures. The next ring out, such as a second ring, may include twice the base number of apertures extending about the first ring. This may follow the scaled pattern as previously described for any number of rings as previously noted. It is to be understood that the figure is simply for illustrative purposes, and encompassed faceplates may be characterized by hundreds or thousands of apertures as noted previously, and which may be configured with any base number of apertures, for example. As illustrated, one or more of the radially outermost rings may be characterized by a reduced number of apertures from the scaled increase in aperture number.

For example, an outermost ring may be ring 40, for example, and with a base number of 7 apertures would be characterized by 280 apertures according to the scaled increase. However, to control edge deposition, the number of apertures may be reduced from the scaled amount by a percentage. For example, instead of 280 apertures, the outermost ring may be characterized by 266 apertures equidistantly spaced about the ring or spaced at an equiangular distance, such as 95% of the number of apertures according to the scaled increase in apertures. In embodiments the number of apertures in the outermost ring 310 may be less than or about 95% of the number of apertures according to the scaled increase in apertures, and may be less than or about 90% of the number of apertures, less than or about 85% of the number of apertures, less than or about 80% of the number of apertures, less than or about 75% of the number of apertures, less than or about 70% of the number of apertures, less than or about 65% of the number of apertures, less than or about 60% of the number of apertures, less than or about 55% of the number of apertures, less than or about 50% of the number of apertures, less than or about 45% of the number of apertures, less than or about 40% of the number of apertures, or less.

Figure 4B:
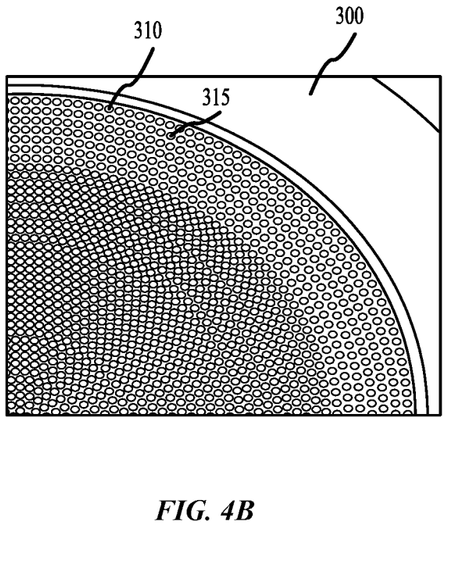
FIG. 4B shows a schematic partial plan view of an exemplary faceplate according to some embodiments of the present technology.

In some embodiments more than one ring from the outermost rings may be characterized by a number of apertures that is reduced from the scaled increase in aperture number, and may be characterized by any reduction percentage as noted above. As illustrated in the figure, eight of the outermost rings are characterized by a reduced number of apertures. For example, in some embodiments more than one ring of apertures may be characterized by the same reduction in apertures, such as less than or about 75% of the number of apertures according to the scaled increase in apertures, or different rings may be characterized by a different reduction. For example, the outermost ring 310 may be characterized by 50% of the apertures according to the scaled increase in apertures, and next inward ring 315, such as the inwardly adjacent ring to the outermost ring may be characterized by 75% of the apertures according to the scaled increase in apertures, such as illustrated in FIG. 4B. This may provide a reduction in deposition at an outer radial region of the substrate, while limiting a drop off effect by tapering the reduction across rows.

Figure 5A:
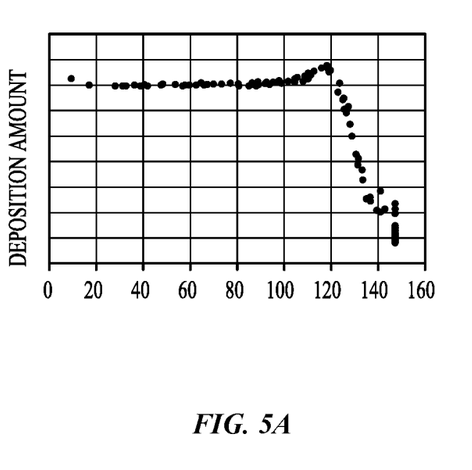
FIG. 5A shows a chart illustrating deposition profiles for an exemplary faceplate according to some embodiments of the present technology.

While any number of rings of apertures may be characterized by a reduction from the scaled number of apertures for that ring, increasing the number of rings having reduced apertures may increase the effect and cause deposition non-uniformity. For example, as discussed above, FIG. 4A may illustrate a faceplate where the eight outermost rings may be characterized by a reduction in apertures, such as 50%, for example. FIG. 5A illustrates a deposition profile extending radially outward across a substrate with such a faceplate. As illustrated, the number of reduced rows causes a significant drop in deposition extending towards the edge of the substrate, which may not improve deposition uniformity. Similarly, the drop from the scaled number of apertures to 50% directly between rows, caused an increase at the relative location of the substrate associated with the drop off in apertures, followed by a significant reduction in deposition. Accordingly, in some embodiments, faceplates may limit the number of rings reduced from the scaled number of apertures to be less than or about ten of the outermost rings, and may be less than or about eight of the outermost rings, less than or about seven of the outermost rings, less than or about six of the outermost rings, less than or about five of the outermost rings, less than or about four of the outermost rings, less than or about three of the outermost rings, less than or about two of the outermost rings, or only the outermost ring may be characterized by a reduction.

Figure 5B:
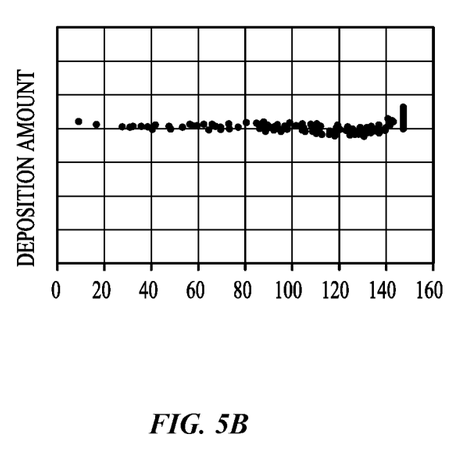
FIG. 5B shows a chart illustrating deposition profiles for an exemplary faceplate according to some embodiments of the present technology.

Additionally, the innermost ring characterized by a reduction in apertures from the scaled increase may maintain greater than or about 40% of the scaled number of apertures for that ring, and may maintain greater than or about 45% of the scaled number of apertures, greater than or about 50% of the scaled number of apertures, greater than or about 55% of the scaled number of apertures, greater than or about 60% of the scaled number of apertures, greater than or about 65% of the scaled number of apertures, greater than or about 70% of the scaled number of apertures, greater than or about 75% of the scaled number of apertures, greater than or about 80% of the scaled number of apertures, greater than or about 85% of the scaled number of apertures, greater than or about 90% of the scaled number of apertures, or more. FIG. 5B may illustrate the deposition profile from the faceplate illustrated in FIG. 4B, where the outermost ring may have a reduced number of apertures, and the next ring inward may be characterized by a reduced number of apertures that is a greater percentage of the scaled number of apertures. As illustrated, a more consistent profile was produced fully across the substrate.

Figure 6:
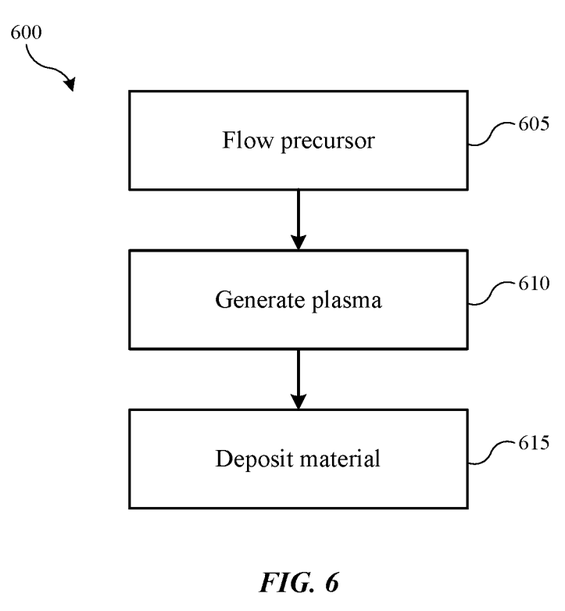
FIG. 6 shows operations of an exemplary method of semiconductor processing according to some embodiments of the present technology.

FIG. 6 shows operations of an exemplary method 600 of semiconductor processing according to some embodiments of the present technology. The method may be performed in a variety of processing chambers, including processing system 200 described above, which may include faceplates according to embodiments of the present technology, such as faceplate 300. Method 600 may include a number of optional operations, which may or may not be specifically associated with some embodiments of methods according to the present technology.

Method 600 may include a processing method that may include operations for forming a hardmask film or other deposition operations. The method may include optional operations prior to initiation of method 600, or the method may include additional operations. For example, method 600 may include operations performed in different orders than illustrated. In some embodiments, method 600 may include flowing one or more precursors into a processing chamber at operation 605. For example, the precursor may be flowed into a chamber, such as included in system 200, and may flow the precursor through one or more of a gasbox, a blocker plate, or a faceplate, prior to delivering the precursor into a processing region of the chamber.

In some embodiments, the faceplate may have a radially outermost ring of apertures characterized by a number of apertures reduced from the scaled increase in aperture number compared to other rings. Any of the other characteristics of faceplates described previously may also be included, including any aspect of faceplate 300, such as that multiple rings may be characterized by a reduction in apertures from a scaled number of apertures. At operation 610, a plasma may be generated of the precursors within the processing region, such as by providing RF power to the faceplate to generate a plasma. Material formed in the plasma may be deposited on the substrate at operation 615. In some embodiments, depending on the thickness of the material deposited, the deposited material may be characterized by a thickness at the edge of the substrate that is less than or about 10% greater than a thickness proximate a mid or center region along a radius of the substrate.

Additionally, the thickness at the edge of the substrate may be less than or about 9% greater than a thickness proximate a mid or center region along a radius of the substrate, and may be less than or about 8% greater, less than or about 7% greater, less than or about 6% greater, less than or about 5% greater, less than or about 4% greater, less than or about 3% greater, less than or about 2% greater, less than or about 1% greater, or may be substantially similar or uniform across positions along the substrate. By utilizing a showerhead including one or more of the outermost rings of apertures characterized by a reduction from a scaled number of apertures per ring, improved uniformity may be provided.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a ring" includes a plurality of such rings, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a gasbox;
a substrate support;
a blocker plate positioned between the gasbox and the substrate support, wherein the blocker plate defines a plurality of apertures through the blocker plate; and
a faceplate positioned between the blocker plate and the substrate support, wherein the faceplate is characterized by a first surface facing the blocker plate and a second surface opposite the first surface, wherein the second surface of the faceplate and the substrate support at least partially define a processing region within the semiconductor processing chamber, wherein the faceplate is characterized by a central axis, wherein the faceplate defines a plurality of apertures through the faceplate distributed in a number of rings, wherein each ring of apertures includes a scaled increase in aperture number from a ring radially inward, wherein the scaled increased is determined by an equation, wherein a radially outermost ring of apertures is characterized by a number of apertures reduced from the scaled increase in aperture number, and wherein the radially outermost ring of apertures is characterized by a number of apertures that is less than or about 75% of a number of apertures that is output by the equation for the radially outermost ring.

2. The semiconductor processing chamber of claim 1, wherein the apertures of the radially outermost ring are distributed equidistantly about the radially outermost ring.

3. The semiconductor processing chamber of claim 1, wherein an inwardly adjacent ring of apertures from the radially outermost ring of apertures is characterized by a number of apertures reduced from the scaled increase in aperture number.

4. The semiconductor processing chamber of claim 3, wherein the inwardly adjacent ring of apertures from the radially outermost ring of apertures is characterized by a number of apertures that is less than or about 75% of the number of apertures according to the scaled increase in apertures.

5. The semiconductor processing chamber of claim 1, wherein the scaled increase in aperture number within each corresponding ring follows an equation: XR, where X is a base number of apertures, and R is a corresponding ring number.

6. The semiconductor processing chamber of claim 5, wherein the faceplate defines at least 30 rings of apertures.

7. The semiconductor processing chamber of claim 5, wherein the base number of apertures is an integer between four and eight.

8. The semiconductor processing chamber of claim 1, further comprising a chamber housing extending about the substrate support, wherein the chamber housing defines an access configured to allow delivery of a semiconductor substrate along a portion of the chamber housing.

9. The semiconductor processing chamber of claim 8, wherein the faceplate is characterized by a reduction of apertures through a section of the faceplate proximate the access in the chamber housing.

10. The semiconductor processing chamber of claim 1, further comprising a pumping liner extending radially about the semiconductor processing chamber between the faceplate and the substrate support, wherein the pumping liner is configured to exhaust effluents radially outward from a processing region of the semiconductor processing chamber.

11. A semiconductor processing chamber faceplate, comprising:
a first surface and a second surface opposite the first surface, wherein:
the faceplate is characterized by a central axis extending through the first surface and the second surface,
the faceplate defines a plurality of apertures through the faceplate distributed in a number of concentric rings about the central axis,
each ring of apertures includes a scaled increase in aperture number from an adjacent ring radially inward of the respective ring,
the scaled increase is determined by an equation,
a radially outermost ring of apertures is characterized by a number of apertures reduced from the scaled increase in aperture number,
the radially outermost ring of apertures is characterized by a number of apertures that is less than or about 75% of a number of apertures that is output by the equation for the radially outermost ring, and the apertures of the radially outermost ring are characterized by an equiangular distribution from one another about the radially outermost ring.

12. The semiconductor processing chamber faceplate of claim 11, wherein the radially outermost ring of apertures is characterized by a number of apertures that is less than or about 50% of the number of apertures determined by the equation that defines the scaled increase in apertures.

13. The semiconductor processing chamber faceplate of claim 11, wherein an inwardly adjacent ring of apertures from the radially outermost ring of apertures is characterized by a number of apertures reduced from the scaled increase in aperture number.

14. The semiconductor processing chamber faceplate of claim 13, wherein the inwardly adjacent ring of apertures from the radially outermost ring of apertures is characterized by a number of apertures that is less than or about 75% of the number of apertures according to the scaled increase in apertures.

15. The semiconductor processing chamber faceplate of claim 11, wherein no more than 5 radially outermost rings are characterized by a number of apertures reduced from the scaled increase in aperture number.

16. The semiconductor processing chamber faceplate of claim 11, wherein the scaled increase in aperture number within each corresponding ring follows an equation: XR, where X is a base number of apertures, and R is a corresponding ring number.

17. The semiconductor processing chamber faceplate of claim 16, wherein the faceplate defines at least 30 rings of apertures.

18. The semiconductor processing chamber faceplate of claim 16, wherein the base number of apertures is an integer between three and eight.

* * * * *